(12) United States Patent
Guha et al.

(10) Patent No.: US 9,899,227 B2
(45) Date of Patent: Feb. 20, 2018

(54) SYSTEM, METHOD AND APPARATUS FOR ION MILLING IN A PLASMA ETCH CHAMBER

(71) Applicant: Lam Research Corporation, Fremont, CA (US)

(72) Inventors: Joydeep Guha, Fremont, CA (US); Butsurin Jinnai, Fremont, CA (US); Jun Hee Han, Fremont, CA (US); Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1094 days.

(21) Appl. No.: 13/771,519

(22) Filed: Feb. 20, 2013

(65) Prior Publication Data

US 2014/0235056 A1    Aug. 21, 2014

(51) Int. Cl.
   *H01J 37/32* (2006.01)
   *H01L 21/3065* (2006.01)
   *H01L 21/02* (2006.01)

(52) U.S. Cl.
   CPC .... *H01L 21/3065* (2013.01); *H01J 37/32403* (2013.01); *H01J 37/32715* (2013.01); *H01J 37/32926* (2013.01); *H01L 21/02057* (2013.01); *H01L 21/02071* (2013.01)

(58) Field of Classification Search
   CPC ........... H01J 37/32403; H01J 37/32715; H01J 37/32926; H01L 21/02057; H01L 21/02071; H01L 21/3065
   USPC .................................................... 204/192.34
   See application file for complete search history.

(56) References Cited

U.S. PATENT DOCUMENTS

| 6,091,081 | A | * | 7/2000 | Matsubara | ............ | H01L 21/312 |
| | | | | | | 257/52 |
| 6,238,582 | B1 | * | 5/2001 | Williams | .................. | C23F 4/00 |
| | | | | | | 216/22 |
| 2006/0021702 | A1 | * | 2/2006 | Kumar | .............. | H01L 21/02071 |
| | | | | | | 156/345.32 |

(Continued)

FOREIGN PATENT DOCUMENTS

JP    2005-268252    *  9/2005

OTHER PUBLICATIONS

Machine Translation of JP 2005-268252 dated Sep. 2005.*

*Primary Examiner* — Rodney McDonald
(74) *Attorney, Agent, or Firm* — Martine Penilla Group, LLP

(57) ABSTRACT

A system and method of ion milling performed in a plasma etch system including a plasma etch chamber, multiple process gas sources coupled to the plasma etch chamber, a radio frequency bias source and a controller. The plasma etch chamber including a substrate support. The substrate support being a non-pivoting and non-rotating substrate support. The substrate support capable of supporting a substrate to be processed on a top surface of the substrate support without use of a mechanical clamp device. The plasma etch chamber also including an upper electrode disposed opposite from the top surface of the substrate support. The radio frequency bias source is coupled to the substrate support. The controller is coupled to the plasma etch chamber, the multiple process gas sources and the radio frequency bias source. The controller including logic stored on computer readable media for performing an ion milling process in the plasma etch chamber.

10 Claims, 4 Drawing Sheets

(56) References Cited

U.S. PATENT DOCUMENTS

2008/0188086 A1 8/2008 Ogasawara
2010/0252531 A1 10/2010 Godet et al.

\* cited by examiner

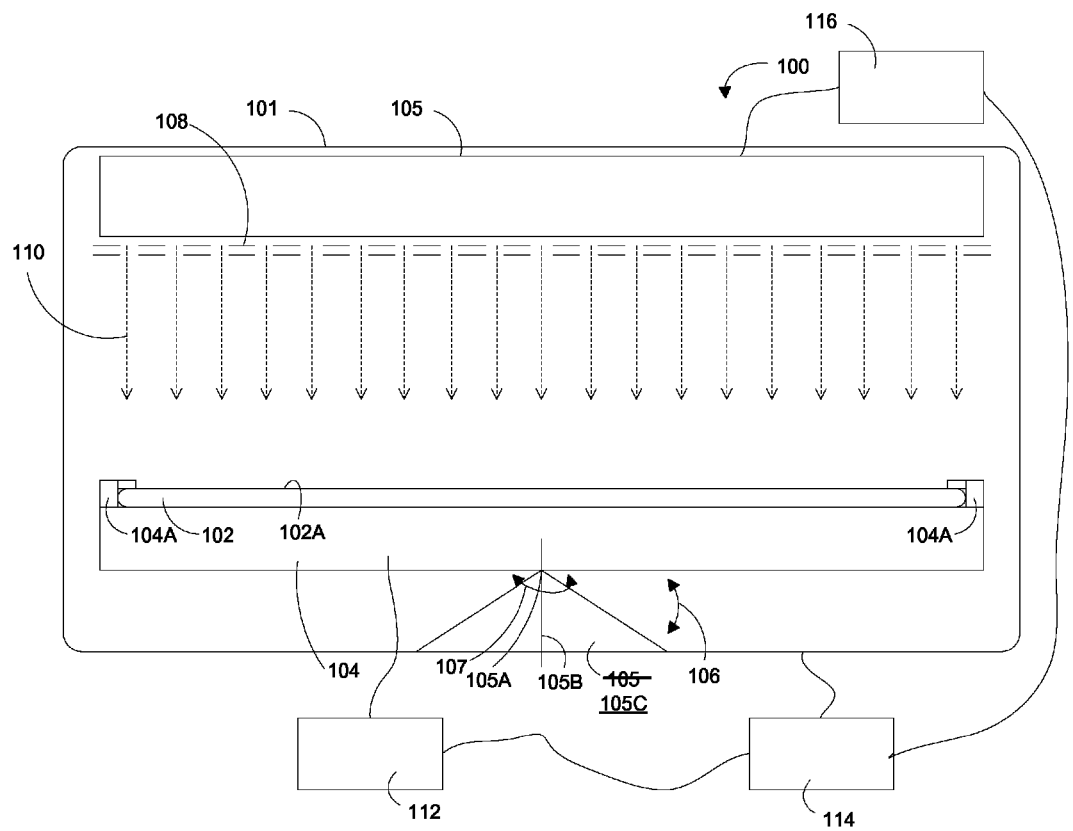
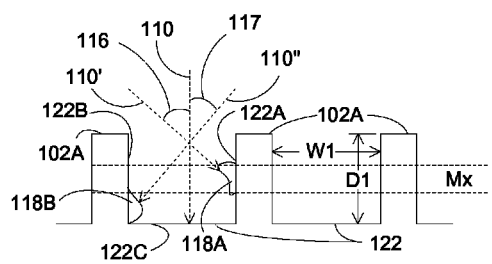 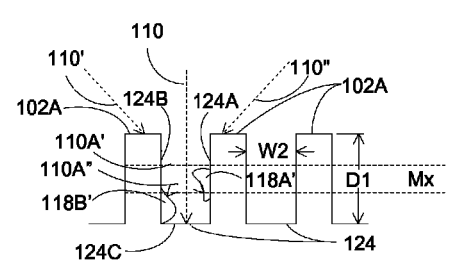
FIG. 1A
PRIOR ART
FIG. 1B
PRIOR ART
FIG. 1C
PRIOR ART

SYSTEM, METHOD AND APPARATUS FOR ION MILLING IN A PLASMA ETCH CHAMBER

BACKGROUND

The present invention relates generally to semiconductor manufacturing, and more particularly, to systems, methods and apparatus for performing ion milling operations in a plasma etch chamber.

Etching many materials often form non-volatile etch process byproducts. By way of example, etching the film stacks of materials to form features in magnetic random access memory (MRAM) and resistive random access memory (RRAM) structures and devices. The non-volatile etch process byproducts can form deposits on the sidewalls of the features. The sidewall deposits cause device malformation such as shortening the active device and other malformations.

Ion milling is used to remove non-volatile etch process byproduct deposits on the sidewalls of the features etched in various non-volatile material layers. Ion milling directs ions at the sidewalls of the features to remove the etch byproduct deposits.

Typical ion milling is ineffective as feature sizes become smaller than 200 nm in width and/or the feature depth to width (aspect) ratio exceeds 1:1. Thus, what is needed is an ion milling process that is effective in feature sizes smaller than 200 nm in width and/or feature aspect ratio exceeds 1:1.

SUMMARY

Broadly speaking, the present invention fills these needs by providing an ion milling system and method that can be applied to the semiconductor substrate in a plasma etch chamber. It should be appreciated that the present invention can be implemented in numerous ways, including as a process, an apparatus, a system, computer readable media, or a device. Several inventive embodiments of the present invention are described below.

One embodiment provides a system and method of ion milling performed in a plasma etch system including a plasma etch chamber, multiple process gas sources coupled to the plasma etch chamber, a radio frequency bias source and a controller. The plasma etch chamber including a substrate support. The substrate support being a non-pivoting and non-rotating substrate support. The substrate support capable of supporting a substrate to be processed on a top surface of the substrate support without use of a mechanical clamp device. The plasma etch chamber also including an upper electrode disposed opposite from the top surface of the substrate support. The radio frequency bias source is coupled to the substrate support. The controller is coupled to the plasma etch chamber, the multiple process gas sources and the radio frequency bias source. The controller including logic stored on computer readable media for performing an ion milling process in the plasma etch chamber.

The multiple process gas sources can includes a mixer and at least two of a Helium source, a Neon source, an Argon source, a Xenon source, and a Krypton source. The logic stored on computer readable media for performing an ion milling process in the plasma etch chamber can include logic stored on computer readable media for injecting a selected combination of the ion milling process gases into the plasma etch chamber, logic stored on computer readable media for generating an ion milling plasma having a selected ion angular distribution and logic stored on computer readable media for volatilizing a deposits on at least one sidewall of a feature formed in the substrate. The logic stored on computer readable media for injecting the selected combination of the ion milling process gases into the plasma etch chamber can include logic stored on computer readable media for determining a location of at least one of the plurality of deposits on the at least one sidewall of the feature formed in the substrate.

The logic stored on computer readable media for injecting the selected combination of ion milling process gases into the plasma etch chamber can include logic stored on computer readable media for selecting an ion milling operating pressure of between about 60 millitorr and about 300 millitorr.

The logic stored on computer readable media for injecting the selected combination of ion milling process gases into the plasma etch chamber can include logic stored on computer readable media for selecting a ratio of masses of the ion milling process gases.

The ion angular distribution includes a range of between about 0 degrees from perpendicular to a surface of the substrate to about 50 degrees from perpendicular to the surface of the substrate. The radio frequency bias source has an output frequency of between about 200 kHz and about 2 MHz.

Another embodiment provides a method of ion milling including placing a substrate in a plasma etch chamber, applying a plasma etch process to the substrate, ending the plasma etch process, injecting a selected combination of ion milling process gases into the plasma etch chamber, generating an ion milling plasma having a selected ion angular distribution and volatilizing at least one deposits on at least one sidewall of a feature formed in the substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 1A is a typical ion milling chamber system.

FIG. 1B is a detailed side view of features etched in one or more layers on the surface of the semiconductor substrate.

FIG. 1C is a detailed side view of features etched in the surface of the semiconductor substrate.

DETAILED DESCRIPTION

Figure 2A:
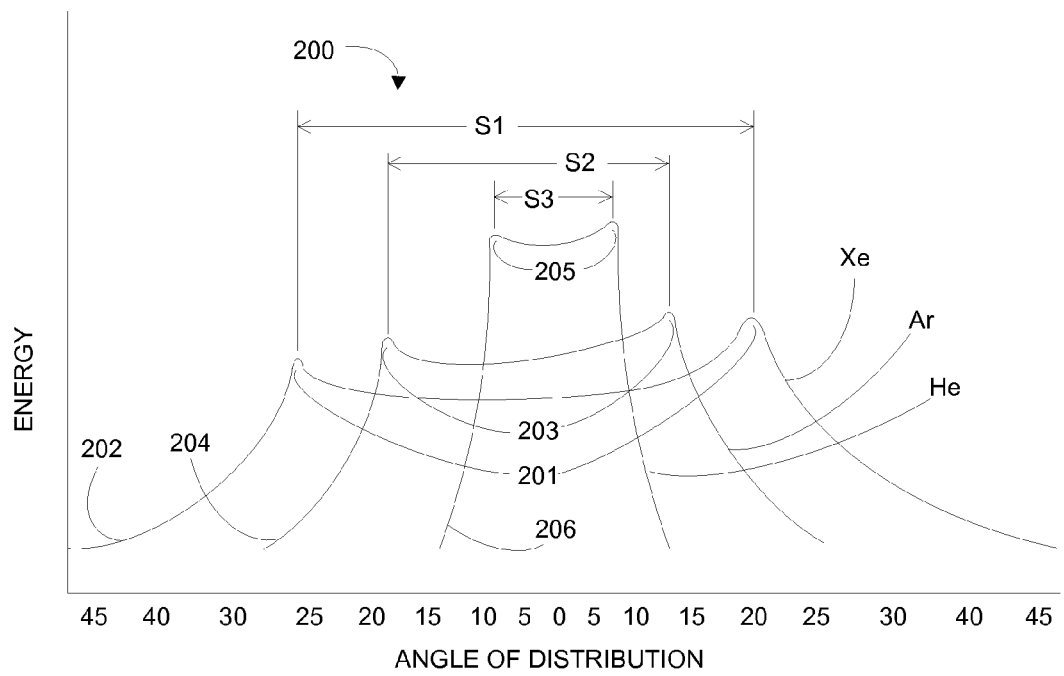
FIG. 2A is a graph of inert gas ion energies of different masses, in accordance with an embodiment of the present invention.

Several exemplary embodiments for an ion milling system and method that can be applied to the semiconductor substrate in a plasma etch chamber will now be described.

It will be apparent to those skilled in the art that the present invention may be practiced without some or all of the specific details set forth herein. The ion milling process described herein is effective on features that are less than 200 nanometers in width and can be applied insitu in a plasma etch chamber using a standard electrostatic chuck to hold the semiconductor substrate.

An ion milling process typically follows a plasma etch process. The plasma etch process often deposits etch residue and byproducts on the sides of an etched feature. The ion milling removes the etch residue and byproducts on the sides of an etched feature.

The typical ion etch process requires removing the semiconductor substrate from the plasma etch chamber to a separate, specialized, ion milling chamber. Moving the semiconductor substrate from the plasma etch chamber to the ion milling chamber requires substantial time and also requires a dedicated ion milling chamber. FIG. 1A is a typical ion milling chamber system 100.

The ion milling chamber 101 includes a special, movable chuck 104, a top electrode 105, a bias source 112, a process gas source 116 and a controller 114. The bias source 112 is coupled to the chuck 104. The controller 114 is coupled to instrumentation (not shown) in the ion milling chamber 101 for monitoring and controlling the processing in the ion milling chamber. The controller 114 is also coupled to the bias source 112 and the process gas source 116 to control and monitor the respective operations thereof.

The chuck 104 includes mechanical clamps 104A for securing the semiconductor substrate 102 to the chuck. The mechanical clamps 104A can damage the edge region of the semiconductor substrate 102. The mechanical clamps 104A also interfere with the ion milling processing of the edge regions. The chuck 104 can move in 2 axes. The chuck 104 can rotate about a rotational axis 105B in directions shown by arrows 107. The chuck 104 can also pivot on fulcrum support 105C about the fulcrum point 105A as shown by arrows 106.

The ion milling chamber 101 operates at a relatively low pressure e.g., less than about 60 millitorr. The ion milling chamber 101 ionizes a single process gas from a single process gas source 116 so as to produce ions 110 that all have equivalent mass. The equivalent mass ions 110 are then passed through multiple electronic grids 108 to accelerate the ions and produce streams of ions in substantially parallel paths toward the surface 102A of the semiconductor substrate 102.

The relative low-pressure of the ionized gas minimizes collisions of the ions 110 due to the low density. The lack of collisions assists in maintaining a substantially straight ion stream path from the grids 108 to the surface 102A of the semiconductor substrate 102.

FIG. 1B is a detailed side view of features 122 etched in one or more layers on the surface 102A of the semiconductor substrate 102. The one or more layers can include a metal layer Mx on the surface 102A of the semiconductor substrate 102. The metal layer Mx can include one or more and combinations of metals. Typical metals include copper, tungsten, cobalt, iron, platinum, iridium, manganese, magnesium, rubidium, aluminum, tantalum and other metals and combinations of metals. The feature 122 has a width W1 of greater than about 200 nm and a depth D1 of less than or equal to W1 and thus has an aspect ratio of about 1:1.

The feature 122 has exemplary etch residues 118A, 118B on the respective feature sidewalls 122B, 122A. When the chuck 104 aligns the surface 102A substantially perpendicular to the ion streams 110, the ion streams can impinge on and interact with the bottom 122C of the feature 122. As the chuck 104 pivots in directions 106 and/or rotates in directions 107, the surface 102A is placed at a corresponding angles 116, 117 such that the ion streams 110', 110" can impinge on and interact with the etch residues 118A, 118B on the respective feature sidewalls 122B, 122A, thus volatilizing the etch residues. The volatilized etch residues can then be drawn out of the ion milling chamber 101.

FIG. 1C is a detailed side view of features 124 etched in the surface 102A of the semiconductor substrate 102. The feature 124 has a width W2 of less than about 200 nm and a depth D1 of greater than W2 and thus has an aspect ratio of greater than about 1:1 (e.g., 1.5:1, 2:1, 3:1, 5:1, 10:1 or more). Width W2 can be substantially smaller than 200 nm. By way of example, Width W2 can be less than about 60 nm.

The feature 124 has etch residues 118A', 118B' on the respective feature sidewalls 124B, 124A. When the chuck 104 aligns the surface 102A substantially perpendicular to the ion streams 110, the ion streams can impinge on and interact with the bottom 124C of the feature 124, similar to as described in FIG. 1B above.

However, as the chuck 104 pivots in directions 106 and/or rotates in directions 107, the surface 102A is placed at a corresponding angles such that the ion streams 110', 110" cannot impinge on and interact with the etch residues 118A', 118B' on the respective feature sidewalls 122B, 122A because the top surface 102A interferes with the ion streams 110' and 110" creating shadows blocking a portion of ion paths 110A', 110A". As a result the ion streams 110' and 110" are ineffective at volatilizing the etch residues 118A', 118B'.

FIG. 2A is a graph 200 of inert gas ion energies of different masses, in accordance with an embodiment of the present invention. Based on the bias frequency, a bimodal distribution of ions and energy results. Helium ions are shown in the He graph. Argon ions are shown in the Ar graph. Xenon ions are shown in the Xe graph. Other inert (i.e., noble gases such as neon, krypton) can also be used as well but helium, argon and xenon are shown to exemplify the principles of the invention.

Referring to the Xe graph, the Xe peaks 201 of ion energy have a relatively large separation distance S1 at lower bias frequencies (e.g., between about 200 kHz and about 2 MHz). The separation distance S1 is broader than at bias frequencies greater than about 2 MHz. The low-energy Xe ions in region 202 of the Xe graph have broader angles of distribution than Xe ions in other portions of the Xe graph. As the energy of the Xe ions increase, near to the Xe peaks 201, the angle of distribution becomes narrower or closer to being straight.

Referring to the Ar graph, the Ar peaks 203 of ion energy have a relatively large separation distance S2 at lower bias frequencies (e.g., between about 200 kHz and about 2 MHz). The separation distance S2 is broader than at bias frequencies greater than about 2 MHz. The low-energy Ar ions in region 204 of the Ar graph have broader angles of distribution than Ar ions in other portions of the Ar graph. As the energy of the Ar ions increase, near to the peaks Ar 203, the angle of distribution becomes narrower or closer to being straight.

Referring to the He graph, the He peaks 205 of ion energy have a relatively large separation distance S3 at lower bias frequencies (e.g., between about 200 kHz and about 2 MHz). The separation distance S3 is broader than at bias frequencies greater than about 2 MHz. The low-energy He ions in region 206 of the He graph have broader angles of distribution than He ions in other portions of the He graph. As the energy of the He ions increase, near to the He peaks 205, the angle of distribution becomes narrower or closer to being straight.

Figure 2B:
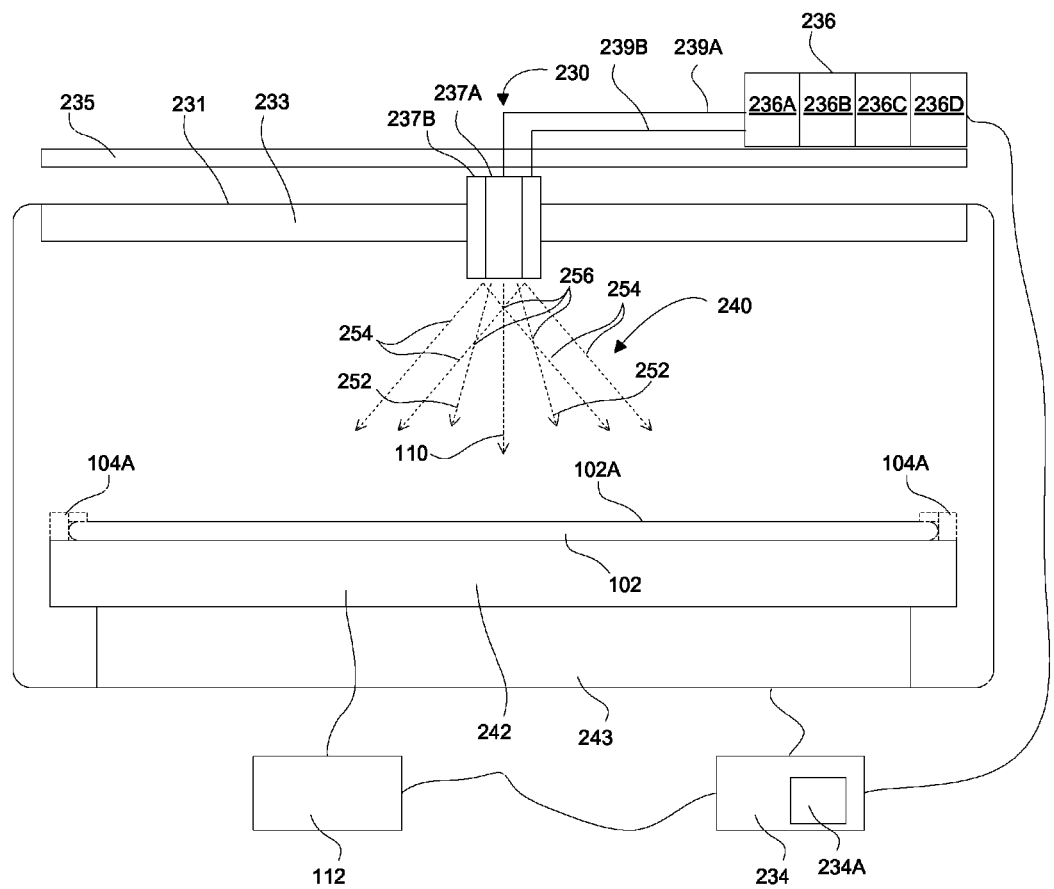
FIG. 2B is a plasma chamber system capable of performing ion milling, in accordance with embodiments of the present invention.

FIG. 2B is a plasma chamber system 230 capable of performing ion milling, in accordance with embodiments of the present invention. The plasma chamber system 230 includes a top electrode 235 mounted external to the chamber. The top electrode coil 235 is disposed over a dielectric (typically quartz) electrode window 233. The plasma chamber 231 is coupled to a multiple process gas source 236 including multiple process gas sources 236A-D and mixing, flow and pressure controls. The multiple process gas source 236 is coupled to the gas injectors 237A, 237B by gas supply lines 239A, 239B.

The chuck 242, in the plasma chamber 231, differs from the pivoting and/or rotatable chuck 104 described above as the chuck 242 can be fixed and non-pivoting and non-rotating. The chuck 242 is supported by chuck support 243. The chuck 242 does not require the mechanical clamps 104A because the chuck 242 is non-pivoting and non-rotating. As a result the lack of the mechanical clamps 104A eliminates the possibility of damage to the edge of the substrate 102 and also eliminates the tendency of the mechanical clamps 104A from interfering with the ion processing of the edge of the surface 102A of the substrate near or under the mechanical clamps.

Referring again to FIGS. 2A and 2B, the Xe, Ar and He graphs show that the lower the energy, the broader the angle of distribution. As a result, lower energy ions can be used to sputter away and remove the non-volatile sidewall deposits on the sidewalls of the features without requiring a movable chuck 104 or mechanical clamps 104A.

The difference in mass of the different ions also affects the angle of distribution. By way of example, a lighter ion will have a narrower range of angle of distribution than a heavier ion. For example, the He graph shows that helium ions have a relatively narrow range of angles of distribution between about 15 degrees to either side of perpendicular to the substrate surface 102A (0 degrees). Similarly, the Ar graph shows argon ions have a somewhat broader range of angles of distribution than the helium ion as the argon ions vary from about 27 degrees to either side of perpendicular to the substrate surface 102A. Similarly, the Xe graph shows xenon ions have a somewhat broader range of angles of distribution than either the helium ion or the argon ions as xenon ions vary from about 45 degrees to either side of perpendicular to the substrate surface 102A.

The difference in mass of the different ions also affects the angle of distribution by collision interactions 256 shown in FIG. 2B. The different mass ions can collide and deflect from each other, further increasing the angle of distribution.

A selected mixture of inert gases (He, Ne, Ar, Kr, Xe) can be used to create an effective ion milling plasma 240. The resulting inert gas ions have different masses and different total momentum cross section and consequently differ in respective transit times through plasma sheath. Due to this effect, the ion milling plasma 240 consisting of the inert gases exhibits a wider spread in ion energy and angular distribution spread over a continuum as compared to a single ion source as used in ion milling process described in FIGS. 1A-1C above.

The wider angular distribution of the selected mixture of inert gas ions in the ion milling plasma 240 can be used to access feature sidewalls 124A, 124B to effectively sputter the etch byproducts 118A', 118B' without the need of a specialized pivoting chuck 104 or mechanical clamps 104A.

The selected mixture of inert gases in the ion milling plasma 240 allows ion milling processes to be performed in a standard etch process chamber 231, using a standard, non-rotating, non-pivoting, electrostatic chuck 242. Thus, ion milling processes can be applied insitu in the plasma etch process chamber 231 without need of moving the substrate 102 from the plasma chamber to a separate ion milling chamber 101.

It should be understood that while the selected mixture of inert gases in the ion milling plasma 240 allows ion milling processes to be performed in a standard etch process chamber 231, the selected mixture of inert gases in the ion milling plasma 240 can also be used in an ion milling chamber having a rotating and/or pivoting chuck 104, as described above.

As described above, the efficiency of the ion milling process is enhanced by using a lower bias RF frequency (e.g., between about 200 KHz to about 2 MHz) in the electrostatic chuck 242. The lower RF frequency makes the RF oscillation time period comparable to the ion transit time through the plasma sheath which increases the split in ion energy distribution with lower energy ions having wider spread of angular distribution.

The ion milling plasma 240 can also be used at a higher pressure than the typical less than about 60 millitorr because the increased pressure results in increased collisions 256 in the ions 110, 252, 254. By way of example, the ion milling plasma 240 can have a pressure of between about 60 millitorr and about 300 millitorr.

While inert gases and mixtures uses are described herein, it should be understood that CO/CH4 and CH4/O2 may also be used in combination with one or more of the inert gases. Mixing CO/CH4, CO/H2, CO, H2 and CH4/O2 with inert gas can improve the effectiveness of the etch process.

The controller 234 includes software and logic 234A, stored on computer readable media. The software and logic 234A includes the logic and operating systems to control the various operational parameters (temperatures, bias, pressures, flow rates, process gas mixtures, etc.) of the plasma chamber system 230.

Figure 2C:
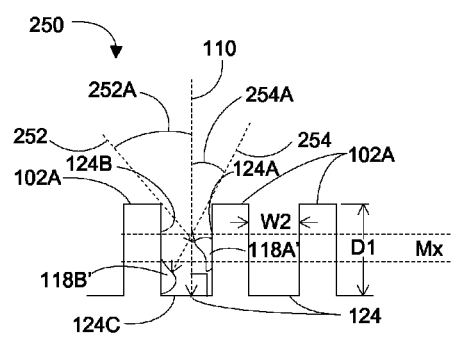
FIG. 2C is a detailed side view of features etched in the surface of the semiconductor substrate, in accordance with embodiments of the present invention.

FIG. 2C is a detailed side view 250 of features 124 etched in the surface 102A of the semiconductor substrate 102, in accordance with embodiments of the present invention. The selected mixture of the process gases, pressure and bias frequency and voltage allows ion streams 252 and 254 to impinge on and interact with deposits 118A', 118B'.

A low pressure (e.g., about 60 millitorr) and or a light mass ions (helium, neon) or single process gas ions tend to follow ion stream 110 that is substantially perpendicular to the surface 102A of the substrate. As a result the lighter mass ions (helium, neon) or single process gas ions can impinge on and interact with the bottom 124C of the feature.

Increasing the operation pressure and/or increasing the ratio of somewhat heavier mass ions (Ar, Kr, Xenon) also generates ion stream 254 and is an angle 254A from perpendicular to the surface 102A of the substrate. As a result the added, somewhat heavier mass ions can impinge on and interact with the deposit 118B' near the bottom 124C of the feature.

Further increasing the operation pressure and/or further increasing the ratio of somewhat heavier mass ions (Ar, Kr, Xenon) also generates ion stream 252 and is an angle 252A from perpendicular to the surface 102A of the substrate. As a result the added, pressure and/or increased ratio of somewhat heavier mass ions can impinge on and interact with the deposit 118A' closer to the surface 102A.

It should be understood that the angular distribution of the ion streams 110, 252, 254 are a continuum from mostly perpendicular ion stream 110 to up to about 50 degrees from perpendicular ion stream 252 and ion stream 254 in the middle of the continuum. The angular distribution is determined by the operating pressure and the ratio of the different masses of the process gases.

Figure 3:
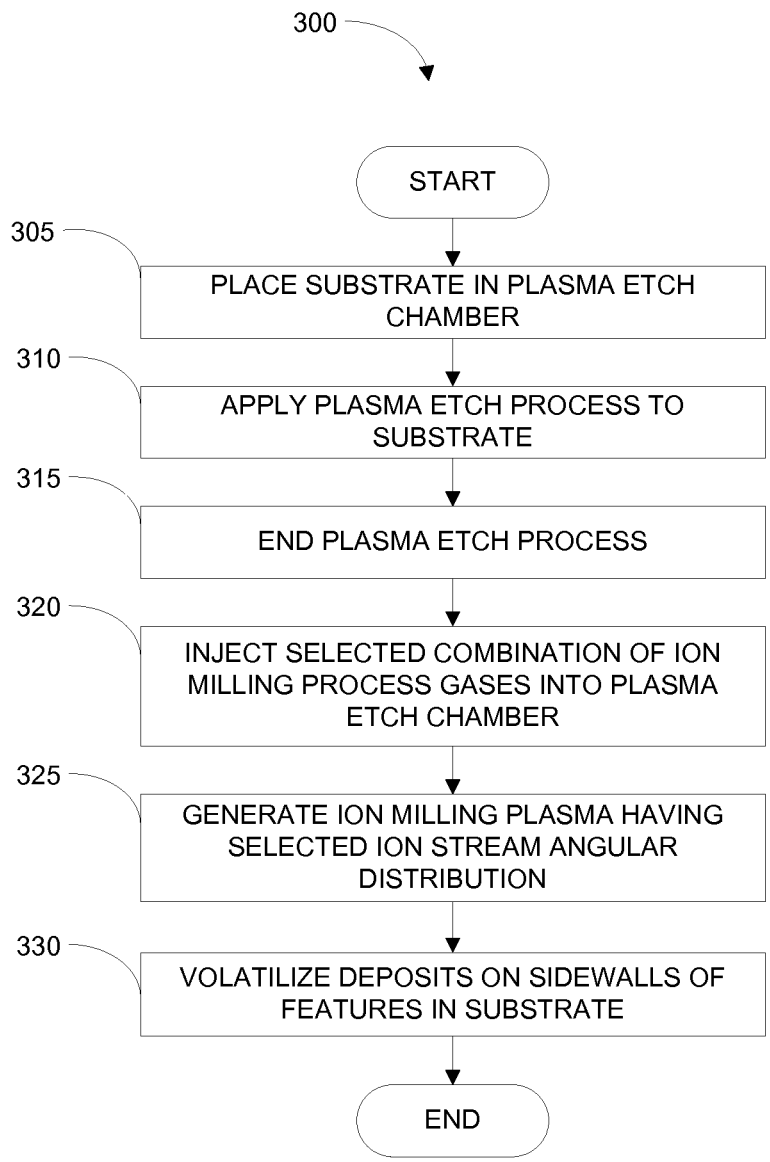
FIG. 3 is a flowchart diagram that illustrates the method operations performed in an insitu ion milling process, in accordance with one embodiment of the present invention.

FIG. 3 is a flowchart diagram that illustrates the method operations 300 performed in an insitu ion milling process, in accordance with one embodiment of the present invention. The operations illustrated herein are by way of example, as it should be understood that some operations may have sub-operations and in other instances, certain operations described herein may not be included in the illustrated operations. With this in mind, the method and operations 300 will now be described.

In an operation 305, a substrate 102 is placed in a plasma etch chamber 231 and secured to the chuck 242. A plasma etch process is applied to the substrate 102 in the plasma etch chamber 231, in an operation 310. The plasma etch process can include multiple processes and subprocesses that can occur within the plasma etch chamber 231.

The plasma etch process ends in an operation 315. Ending the plasma etch process can include purging and evacuating the plasma etch chamber 231.

In an operation 320, an ion milling process is initiated. Initiating the ion milling process includes injecting a selected combination of ion milling process gases into plasma etch chamber 231. The selected combination of ion milling process gases will include gases having different masses so as to form ion streams having different angles of distribution.

The ratio of the combination of different ion milling process gases is determined by the location of the deposits 118A', 118B' on the feature sidewalls 124A, 124B. By way of example, if the deposits 118A', 118B' are located nearer the bottom 124C of the feature 124, then more lighter mass gases (e.g., helium, neon, etc.) can be used as lighter mass gases tend to generate ion drilling plasmas having a narrow angular distribution ion drilling streams of about 10 to about 15 degrees. If the deposits 118A', 118B' are located closer to the top surface 102A, then more heavier mass gases (e.g., argon, xenon, etc.) can be used as heavier mass gases tend to generate ion drilling plasmas having a broader angular distribution of the ion drilling streams of up to about 50 degrees angular distribution.

Similarly, process pressure can be selected to select the desired angular distribution of the ion drilling streams. By way of example, a lower pressure (e.g., about 60 millitorr) generates a narrower angular distribution ion drilling streams as collisions of ions is reduced. Conversely, a higher pressure (e.g., about 150 millitorr to about 300 millitorr) generates a broader angular distribution ion drilling streams as collisions of ions is increased. The process pressure and selected mixture of process gases can be used in combination to select a desired angular distribution ion drilling streams.

In an operation 325, an ion milling plasma is generated. As described above, the ion milling plasma has a selected ion angular distribution. The deposits 118A', 118B' are volatilized in an operation 330. The volatilized deposits can then be drawn out of the process chamber 231 and the method operations can end.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of ion milling comprising:
    placing a substrate on a non-pivoting support in a plasma etch chamber;
    applying a plasma etch process to the substrate to form a feature;
    ending the plasma etch process when the feature is formed;
    selecting, responsive to a controller of the plasma etch chamber, an ion angular distribution for an ion milling plasma to be generated from a combination of inert gases that has a plurality of distinct masses by injecting, after the feature is formed, a selected combination of a plurality of ion milling process gases into the plasma etch chamber to define the selected ion angular distribution for the ion milling plasma to be generated, wherein the selected combination of the plurality of ion milling process gases has an increased ratio of a lighter mass ion milling process gas including at least one of helium and neon relative to a heavier mass ion milling process gas including at least one of argon, xenon, and krypton to define a narrow ion angular distribution for the ion milling plasma to be generated, and has an increased ratio of a heavier mass ion milling process gas including at least one of argon, xenon, and krypton relative to a lighter mass ion milling process gas including at least one of helium and neon to define a broad ion angular distribution for the ion milling plasma to be generated;

generating, by applying radio frequency (RF) power to the plasma etch chamber, the ion milling plasma having the selected ion angular distribution, the ion milling plasma producing ions with different transmit times through a plasma sheath of the ion milling plasma; and volatilizing, using the ion milling plasma, at least one of a plurality of deposits on at least one sidewall of the feature formed in the substrate.

2. The method of claim 1, wherein injecting the selected combination of the plurality of ion milling process gases into the plasma etch chamber includes determining a location of at least one of the plurality of deposits on the at least one sidewall of the feature formed in the substrate.

3. The method of claim 2, wherein injecting the selected combination of the plurality of ion milling process gases into the plasma etch chamber includes selecting an ion milling operating pressure.

4. The method of claim 3, wherein the ion milling operating pressure is between about 60 millitorr and about 300 millitorr.

5. The method of claim 2, wherein injecting the selected combination of the plurality of ion milling process gases into the plasma etch chamber includes selecting a ratio of the masses of the plurality of ion milling process gases.

6. The method of claim 1, wherein the RF power applied to the plasma etch chamber has a frequency of between about 200 kHz and about 2 MHz.

7. The method of claim 1, wherein the narrow ion angular distribution of the ion milling plasma to be generated includes a range from zero degrees from perpendicular to a surface of the substrate to 15 degrees from perpendicular to the surface of the substrate.

8. The method of claim 1, wherein the broad ion angular distribution of the ion milling plasma to be generated includes a range from zero degrees from perpendicular to a surface of the substrate to 50 degrees from perpendicular to the surface of the substrate.

9. A method, comprising:
subjecting a substrate to plasma etching in a plasma etch chamber to form a feature;
stopping the plasma etching when the feature is formed; and
subjecting, in the same plasma etch chamber used to subject the substrate to plasma etching without removing the substrate from the plasma etch chamber, the substrate to a byproduct removal operation to remove etching byproducts from the feature, the byproduct removal operation including,
  introducing a mixture of inert gases into the plasma etch chamber, the mixture of inert gases containing at least one of helium and neon and at least one of argon, xenon, and krypton,
  selecting, responsive to a controller of the plasma etch chamber, an ion angular distribution for an ion milling plasma to be generated from the mixture of inert gases by adjusting a pressure of the mixture of inert gases within a range from 60 millitorr to 300 millitorr, wherein the pressure of the mixture of inert gases is adjusted to a lower pressure within the range from 60 millitorr to 300 millitorr to select a narrow ion angular distribution for the ion milling plasma to be generated, the narrow ion angular distribution for the ion milling plasma to be generated including a range from zero degrees from perpendicular to a surface of the substrate to 15 degrees from perpendicular to the surface of the substrate, and the pressure of the mixture of inert gases is adjusted to a pressure within the range from 150 millitorr to 300 millitorr to select a broad ion angular distribution for the ion milling plasma to be generated, the broad ion angular distribution for the ion milling plasma to be generated including a range from zero degrees from perpendicular to a surface of the substrate to 50 degrees from perpendicular to the surface of the substrate,
  applying radio frequency (RF) power to the plasma etch chamber at a frequency in a range from 200 KHz to 2 MHz to generate the ion milling plasma having the selected ion angular distribution, and
  using the ion milling plasma to remove etching byproducts from a sidewall of the feature.

10. The method of claim 9, wherein the substrate is placed on a non-pivoting support in the plasma etch chamber.

* * * * *